United States Patent
Yang et al.

(10) Patent No.: US 11,616,098 B2
(45) Date of Patent: Mar. 28, 2023

(54) THREE-DIMENSIONAL MEMORY ARRAYS, AND METHODS OF FORMING THE SAME

(71) Applicant: Micron Technology, Inc., Boise, ID (US)

(72) Inventors: Lingming Yang, Meridian, ID (US); Karthik Sarpatwari, Boise, ID (US); Fabio Pellizzer, Boise, ID (US); Nevil N. Gajera, Meridian, ID (US); Lei Wei, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/833,596

(22) Filed: Jun. 6, 2022

(65) Prior Publication Data

US 2022/0302212 A1    Sep. 22, 2022

Related U.S. Application Data

(62) Division of application No. 16/870,239, filed on May 8, 2020, now Pat. No. 11,355,554.

(51) Int. Cl.
*H01L 27/24*       (2006.01)
*H01L 23/528*      (2006.01)
(Continued)

(52) U.S. Cl.
CPC .......... *H01L 27/249* (2013.01); *H01L 23/528* (2013.01); *H01L 23/53257* (2013.01); *H01L 45/06* (2013.01); *H01L 45/1226* (2013.01); *H01L 45/1253* (2013.01); *H01L 45/144* (2013.01); *H01L 45/1675* (2013.01)

(58) Field of Classification Search
CPC ............................ H01L 27/249; H01L 23/528
See application file for complete search history.

(56) References Cited

U.S. PATENT DOCUMENTS

| 8,729,523 | B2  | 5/2014 | Pio |
|---|---|---|---|
| 8,841,649 | B2* | 9/2014 | Pio .......................... H01L 45/04 |
|   |   |   | 257/E45.001 |

(Continued)

FOREIGN PATENT DOCUMENTS

| TW | 202008357 A | 2/2020 |
|---|---|---|
| TW | 202013369 A | 4/2020 |

OTHER PUBLICATIONS

International Search Report and Written Opinion from related International Patent Application No. PCT/US2021/028290, dated Aug. 4, 2021, 10 pages.

(Continued)

*Primary Examiner* — Caleb E Henry
(74) *Attorney, Agent, or Firm* — Brooks, Cameron & Huebsch, PLLC

(57) ABSTRACT

An example apparatus includes a three-dimensional (3D) memory array including a sense line and a plurality of vertical stacks. Each respective on of the vertical stacks includes a different respective portion of the sense line, a first memory cell coupled to that portion of the sense line, a second memory cell coupled to that portion of the sense line, a first access line coupled to the first memory cell and a second access line coupled to the second memory cell. The first and second access lines are perpendicular to the sense line.

20 Claims, 9 Drawing Sheets

(51) Int. Cl.
*H01L 45/00* (2006.01)
*H01L 23/532* (2006.01)

(56) References Cited

U.S. PATENT DOCUMENTS

| | | |
|---|---|---|
| 8,891,280 B2 | 11/2014 | Castro et al. |
| 9,025,398 B2 | 5/2015 | Flores |
| 9,245,926 B2 * | 1/2016 | Kau .................. G11C 13/0026 |
| 10,134,470 B2 | 11/2018 | Tortorelli et al. |
| 10,373,653 B2 | 8/2019 | Lee et al. |
| 10,381,409 B1 | 8/2019 | Zhou et al. |
| 10,424,728 B2 | 9/2019 | Fratin et al. |
| 10,461,125 B2 | 10/2019 | Pirovano et al. |
| 10,490,602 B2 | 11/2019 | Pellizzer et al. |
| 10,497,437 B1 | 12/2019 | Ho et al. |
| 10,593,399 B2 | 3/2020 | Fratin et al. |
| 10,600,468 B2 | 3/2020 | Pan et al. |
| 2003/0223292 A1 | 12/2003 | Nejad et al. |
| 2007/0258281 A1 | 11/2007 | Ito |
| 2008/0037179 A1 | 2/2008 | Ito |
| 2011/0101298 A1 | 5/2011 | Tang |
| 2011/0215396 A1 * | 9/2011 | Tang ..................... H01L 21/762 257/E21.409 |
| 2011/0215408 A1 * | 9/2011 | Tang .................. H01L 27/1211 257/E29.273 |
| 2011/0316063 A1 | 12/2011 | Tang |
| 2012/0120728 A1 | 5/2012 | Kim et al. |
| 2012/0205736 A1 * | 8/2012 | Housley ................ H01L 27/088 257/329 |
| 2013/0069028 A1 | 3/2013 | Wells |
| 2013/0070511 A1 | 3/2013 | Wells |
| 2014/0104918 A1 | 4/2014 | Castro |
| 2014/0104938 A1 | 4/2014 | Castro |
| 2014/0104968 A1 | 4/2014 | Flores |
| 2014/0226392 A1 | 8/2014 | Sandhu et al. |
| 2015/0028280 A1 | 1/2015 | Sciarrillo |
| 2016/0049404 A1 * | 2/2016 | Mariani ................ H01L 29/744 257/329 |
| 2016/0141337 A1 | 5/2016 | Shimabukuro et al. |
| 2017/0092843 A1 | 3/2017 | Torok |
| 2017/0133433 A1 | 5/2017 | Lee et al. |
| 2018/0218765 A1 | 8/2018 | Derner |
| 2018/0323199 A1 | 11/2018 | Roberts |
| 2018/0323200 A1 | 11/2018 | Tang |
| 2018/0374541 A1 | 12/2018 | Jung et al. |
| 2019/0006376 A1 | 1/2019 | Ramaswamy |
| 2019/0081061 A1 | 3/2019 | Fessariol |
| 2019/0326356 A1 | 10/2019 | Castro et al. |
| 2019/0326357 A1 | 10/2019 | Castro et al. |
| 2019/0327835 A1 | 10/2019 | Castro et al. |
| 2021/0050045 A1 | 2/2021 | Sarpatwari |
| 2021/0351234 A1 * | 11/2021 | Yang ..................... H01L 23/528 |

OTHER PUBLICATIONS

Office Action from related Taiwan Patent Application No. 110114486, dated Nov. 29, 2021, 9 pages.

* cited by examiner

THREE-DIMENSIONAL MEMORY ARRAYS, AND METHODS OF FORMING THE SAME

PRIORITY INFORMATION

This application is a Divisional of U.S. application Ser. No. 16/870,239, filed on May 8, 2020, which will issue as U.S. Pat. No. 11,355,554 on Jun. 7, 2022, the contents of which are incorporated herein by reference.

TECHNICAL FIELD

The present disclosure relates generally to semiconductor devices and methods, and more particularly to three-dimensional memory arrays, and methods of forming the same.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in a cross-point architecture with memory cells (e.g., resistance variable cells) being located at intersections of a first and second signal lines used to access the cells (e.g., at intersections of access lines and sense lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can comprise a single material which can serve as both a select element and a storage element for the memory cell.

DETAILED DESCRIPTION

Figure 1:
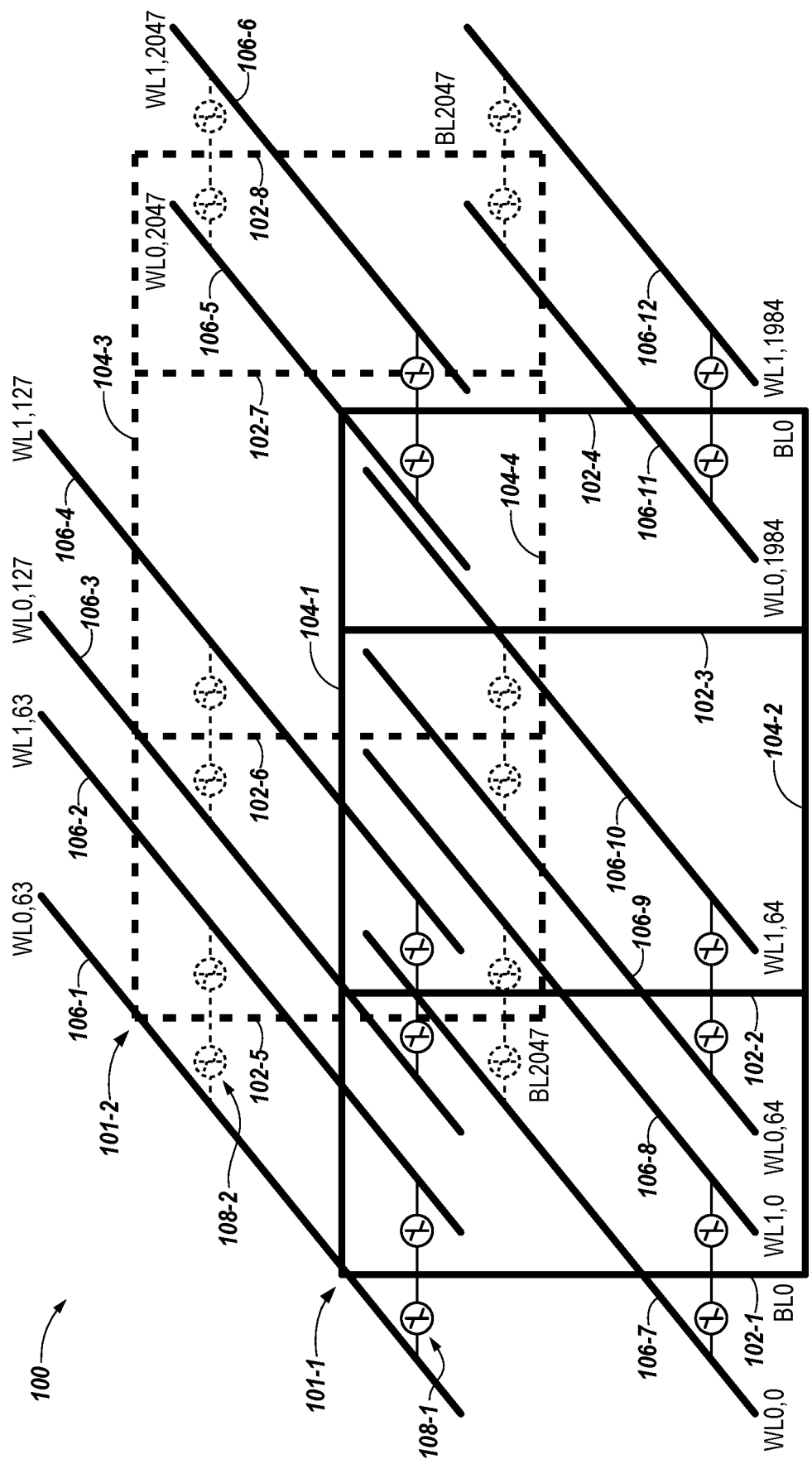
FIG. 1 illustrates a three-dimensional (3D) view of an example 3D memory array having a sense line formed in accordance with a number of embodiments of the present disclosure.

The present disclosure includes apparatuses for three-dimensional memory arrays, and methods of forming the same. An embodiment includes a sense line and plurality of vertical stacks, wherein each respective one of the vertical stacks includes a different respective portion of the sense line, a first memory cell coupled to that portion of the sense line, a second memory cell coupled to that portion of the sense line, a first access line coupled to the first memory cell, wherein the first access line is perpendicular to the sense line, and a second access line coupled to the second memory cell, wherein the second access line is perpendicular to that portion of the sense line.

Various types of memory devices, including arrays of volatile and/or non-volatile memory cells (e.g., a memory array) are disclosed, where a sense line is formed to reduce cross tile difference and improve current delivery in semiconductor structures. As used herein, the term "cross tile difference" may refer to voltage spike in a memory cell caused by supplying an increased amount of current to a different memory cell on the same sense line that is farther away from the voltage source. In one example, a current flowing from a voltage source to a specific memory cell may flow through other memory cells and other electrical components connected to the sense line. The magnitude of the current to the memory cell may be reduced due to the resistance of these other cells and components along the sense line and the connectors used to connect them to the sense line. This reduction of current may cause the magnitude of the current to be too small for the memory cell to conduct its intended function (e.g., be programmed or sensed as intended) when the memory cell receives the reduced current, which may decrease the performance of the memory array.

As such, a sense line that will allow current to flow to its intended memory cell while reducing the amount of current lost in transit due to the resistance of other memory cells and components along the sense line is beneficial. For example, reducing the loss in current while flowing through the sense line may ensure the magnitude of the current that reaches the memory cell is sufficient for the cell to conduct its intended function, and therefore may increase the performance of the memory array. Example embodiments herein disclose a process for forming a sense line that will reduce the amount of current lost while flowing to a memory cell.

Forming the sense line as described herein may result in an increased memory density of the 3D memory array. As used herein, the term "memory density" can refer to the amount of information that can be stored in a specified portion of the memory array. The more information that can be stored in a specified portion of the memory array, the higher the density of the memory array. The ability to store more information in a specified portion of the memory array may allow the memory array to store more data in less space. This may allow more memory to be stored in the memory device in which the memory array was formed. This may allow for more space to be used to incorporate and/or improve other aspects of the memory device.

Vertical portions of the sense line may be formed in a plurality of openings in layers of a storage element material and a dielectric material. In some embodiments, the vertical sense line material may be formed in the plurality of openings using atomic layer deposition (ALD). In some embodiments, the sense line material may be a material compatible with ALD, such as, but not limited to, a titanium nitride (TiN) material.

Forming a sense line that will reduce the amount of current lost while flowing through the sense line and increase the density of the memory array may involve depositing the sense line material in an opening formed in layers of dielectric material and storage element material. In some embodiments, horizontal portion of the sense line may connect the vertical portions of the sense line at the top and/or bottom of a vertical stack.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something may refer to one or more such things. For example, a number of vertical portions of a sense line may refer to at least one vertical portion of a sense line.

The figures herein follow a numbering convention in which the first digit or digits correspond to the figure number of the drawing and the remaining digits identify an element or component in the drawing. Similar elements or components between different figures may be identified by the use of similar digits. For example, reference numeral 102 may reference element "02" in FIG. 1, and a similar element may be referenced as 202 in FIG. 2. Multiple analogous elements within one figure may be referenced with a reference numeral followed by a hyphen and another numeral or a letter. For example, 104-1 may reference element 04-1 in FIGS. 1 and 104-2 may reference element 04-2, which may be analogous to element 104-1. Such analogous elements may be generally referenced without the hyphen and extra numeral or letter. For example, elements 104-1 and 104-2 or other analogous elements may be generally referenced as 104.

FIG. 1 illustrates a 3D view of an example 3D memory array 100 having a sense line formed in accordance with a number of embodiments of the present disclosure. For example, as shown in FIG. 1, array 100 includes sense lines 101-1 and 101-2 (individually or collectively referred to as sense lines 101), vertical portions 102-1, 102-2, 102-3, 102-4, 102-5, 102-6, 102-7, and 102-8 (individually or collectively referred to as vertical portions 102) of the sense lines 101, horizontal portions 104-1, 104-2, 104-3, and 104-4 (individually or collectively referred to as horizontal portions 104) of sense lines 101, access lines 106-1, 106-2, 106-3, 106-4, 106-5, 106-6, 106-7, 106-8, 106-9, 106-10, 106-11, and 106-12 (individually or collectively referred to as access lines 106), and memory cells 108-1 and 108-2 (individually or collectively referred to as memory cells 108) coupled to the vertical portions of the sense lines 101 and the access lines 106. Embodiments of the present disclosure are not, however, limited to a particular number of sense lines, access lines, or memory cells.

The memory array 100 may include sense lines 101. The sense lines 101 may also be referred to as conductive lines, data lines, or bit lines. A current applied to the apparatus 100 can flow through the sense lines 101 and the access lines 106 to select a memory cell 108. The access lines 106 can also be referred to as conductive lines or word lines. Each of a plurality of vertical portions 102 of the sense line 101 may be included in each of a plurality of vertical stacks, as will be further described herein (e.g., in connection with FIG. 4). In some embodiments, the vertical portions 102 of the sense line 101 may be connected by horizontal portions 104 of the sense line 101 at a top portion and a bottom portion of the vertical stacks.

In some embodiments, the horizontal portions 104-2 and 104-4 of the sense line 101 at the bottom portion of the vertical stacks may be formed in a substrate material of the 3D memory array. For example, the horizontal portion 104-2 and 104-4 of the sense line 101 may be formed before other semiconductor materials, such as dielectric materials and storage element materials, are formed on the substrate material. The vertical portions 102 of the sense line 101 may then be formed over the horizontal portion 104-2 and 104-4 of the sense line 101. The vertical portions 102 may be formed such that the vertical stacks in which the vertical portions 102 are included may be connected to the horizontal portion 104-2 and 104-4. In some embodiments, horizontal portions 104-1 and 104-3 may then be formed over the vertical portions 102 and connect to the top portion of the vertical stacks in which the vertical portions 102 are included. In some embodiments, the horizontal portion 104-1 and 104-3 of the sense line 101-1 at the top portion of the vertical stacks may align with the horizontal portion 104-2 and 104-4 of the sense line 101-1 at the bottom portion of the vertical stacks.

In some embodiments, activating (e.g., applying a current to) a horizontal portion 104 of the sense line 101 at the bottom portion or the top portion of the vertical stacks may activate the different respective portions of the sense line 101 of each vertical stack. For example, activating a horizontal portion 104-1 of the sense line 101 at the top portion of the vertical stacks may activate the vertical portions 102 of the sense line 101 in the vertical stacks and a horizontal portion 104-2 of the sense line 101 at the bottom portion of the vertical stacks. The vertical portions 102 of the sense line 101 and the horizontal portions 104 of the sense line 101 may be formed as a single sense line. A current applied to any vertical portion 102 or horizontal portion 104 of the sense line 101 may be able to flow to other vertical portions 102 and horizontal portions 104 of the sense line 101. Therefore, a current applied to any portion of the sense line 101 to activate that portion of the sense line 101 may also flow to the other portions of the sense line 101 and activate those portions as well.

Applying a current to the sense line 101 and an access line 106 may select a memory cell 108 coupled to sense line 101 and access line 106 that received the current. Any memory cell 108 coupled to any portion of the sense line 101 will receive a current applied to any portion of the sense line 101. To select a memory cell, both the sense line 101 and the access line 106 to which the memory cell 108 is coupled must be activated. Therefore, a memory cell 108 coupled to the sense line 101 may be selected by applying a current to any portion of the sense line 101 and applying a current to the word line 106 coupled to the memory cell 108.

The sense line 101 may provide benefits to a memory array such as reducing cross tile difference and improving current delivery within the memory array. As stated above, cross tile difference is a voltage spike in a memory cell that results from applying an increased amount of current to a memory cell on the same sense line but farther away from the voltage source. The amount of the current is increased to overcome the parasitic resistance of the memory cell farther away from the voltage source. As used herein, the term "parasitic resistance" can refer to a resistance in an electrical component that was not included in the original design and is not desirable for the electrical component to have for its intended purpose. Parasitic resistance is the natural and unintended resistance of an electrical component as a result of the materials that comprise the electrical component and the manufacturing of the electrical component. A current applied to a sense line 101 or an access line 106 may be reduced as it flows through the sense line 101 or access line 106. An increased amount of current may be applied to the sense line 101 to compensate for the reduction of current while flowing to the intended memory cell such that the current is still sufficient to power the memory cell after being reduced. However, this may result in too much current being applied to a memory cell 108 that is closer than the intended memory cell 108 and cause the closer memory cell 108 to experience a voltage spike. If the closer memory cell 108 is a phase-change memory cell, this voltage spike may unintentionally cause the phase-change memory cell to change states.

As used herein, the term "phase-change memory" can refer to a type of RAM that stores data by altering the state of the storage element material from which the memory device was fabricated. In some embodiments, the storage element material may be a chalcogenide material. Examples of chalcogenide materials that can serve as the storage element material can include indium(In)-antimony(Sb)-tellurium(Te) (IST) materials, such as $In_2Sb_2Te_5$, $In_1Sb_2Te_4$, $In_1Sb_4Te_7$, etc., and germanium(Ge)-antimony(Sb)-tellurium(Te) (GST) materials, such as $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other chalcogenide materials, including, for instance, alloys that do not change phase during the operation (e.g., selenium-based chalcogenide alloys). Further, the chalcogenide material may include minor concentrations of other dopant materials. The hyphenated chemical composition notation, as used herein, indicates the elements included in a particular mixture or compound, and is intended to represent all stoichiometries involving the indicated elements As used herein, the term "change states" refers to the storage element material changing its state from an amorphous state to a polycrystalline state, or from a polycrystalline state to an amorphous state. The storage element material may change its state in reaction to the heat generated by a current that is being applied to the storage element material. Unintentionally changing the state of the storage element material may be detrimental to the memory array in which the storage element material was formed. For example, unintentionally changing the state of the storage element material may cause inaccurate reads. The two states of the storage element material may have different resistances. Circuitry may be formed around the storage element material to read the resistance of the storage element material. Reading the resistance of the storage element material may allow the circuitry to detect whether a "1" or a "0" is stored on the memory cell formed from the storage element material. Unintentionally changing the state of the memory cell may cause the memory cell to erroneously store a "1" or a "0" when it is intended to store the opposing value. This may decrease the performance of the memory array since the memory array will be storing a value opposite of the value intended for the memory array to perform its intended function.

The vertical portions 102 and horizontal portions 104 of the sense line 101 may improve the flow of the current through the memory array and reduce the voltage spikes described above. In some embodiments, a current applied to the sense line 101 may flow through the horizontal portion 104 of the sense line 101 connected at the bottom portion of the vertical stacks. For example, if the vertical portion 102-1 of the sense line 101-1 is closer to a power source than the vertical portion 102-4 of the sense line 101-1, the current may flow to the vertical portion 102-4 of the sense line 101-1 by flowing through the horizontal portion 104-2. This may prevent the current from flowing through multiple other areas of the memory array and, therefore, reduce the amount of current lost while flowing to the vertical portion 102-4 of the sense line 101-1. The amount of current lost while flowing to the vertical portion 102-4 of the sense line 101-1 may be reduced because, by flowing through the horizontal portion 104-2 of the sense line 101-1 instead of an alternate route through the memory array, the current may not flow through a variety of electrical components and lose current to those electrical components' parasitic resistances. The horizontal portion 104-2 of the sense line 101-1 may have a parasitic resistance but that parasitic resistance may be lower than the parasitic resistance of the electrical components on an alternative route through the memory cell. Therefore, having the current flow through the horizontal portion 104-2 of the sense line 101-1 may reduce the amount of current lost while flowing through the memory array. This may improve the flow of current and avoid the voltage spike discussed above. In some embodiments, the current may flow through the horizontal portion 104-1 of the sense line 101-1 and experience a similarly improved current flow as may be experienced by flowing through the horizontal portion 104-2 of the sense line 101-1.

Figure 2:
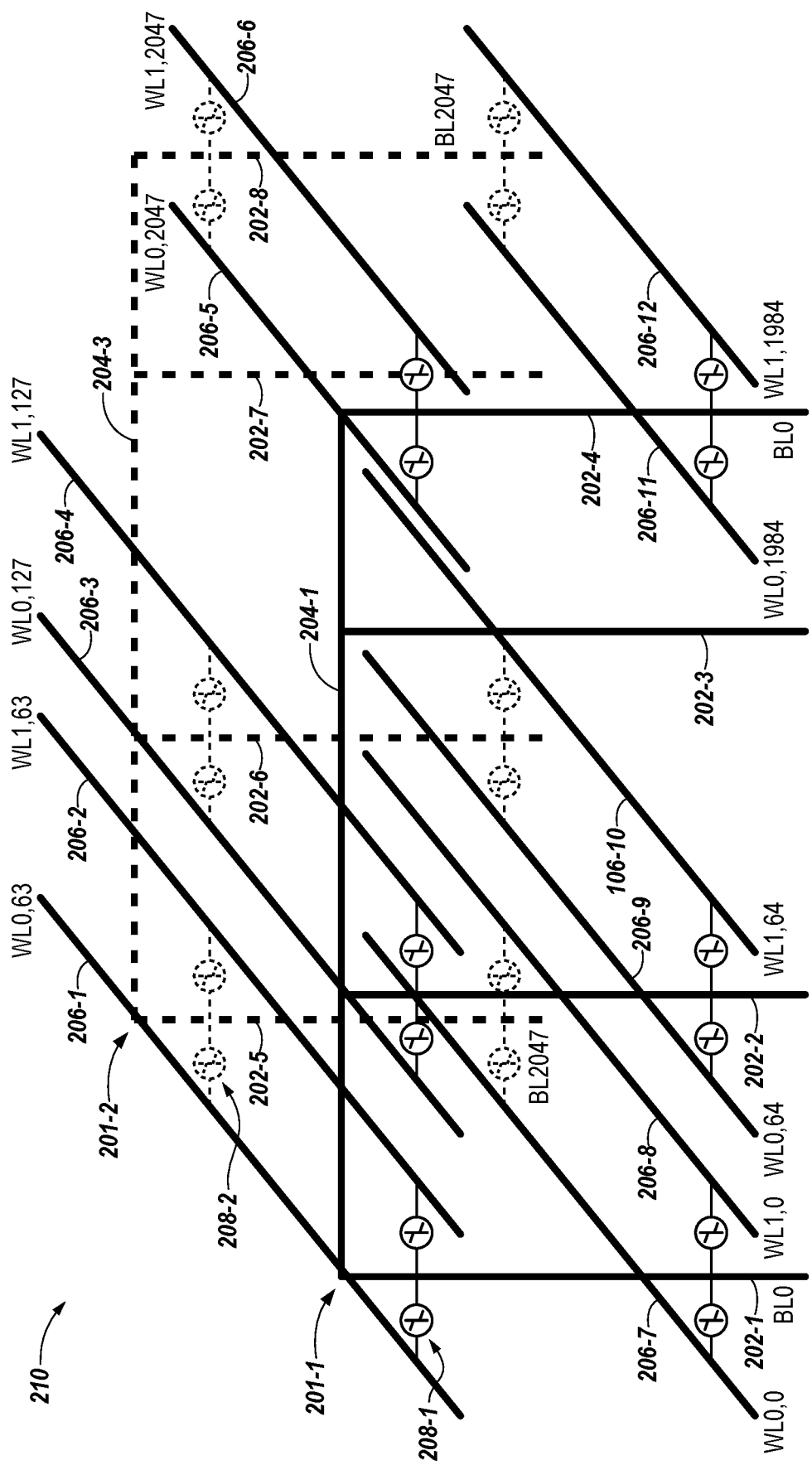
FIG. 2 illustrates a three-dimensional (3D) view of another example 3D memory array having a sense line formed in accordance with a number of embodiments of the present disclosure.

FIG. 2 illustrates a 3D view of an example 3D memory array 210 having a sense line formed in accordance with a number of embodiments of the present disclosure. For example, as shown in FIG. 2, array 210 includes sense lines 201-1 and 201-2 (individually or collectively referred to as sense lines 201), vertical portions 202-1, 202-2, 202-3, 202-4, 202-5, 202-6, 202-7, and 202-8 (individually or collectively referred to as vertical portions 202) of the sense lines 201, horizontal portions 204-1 and 204-3 (individually or collectively referred to as horizontal portions 204) of sense lines 201, access lines 206-1, 206-2, 206-3, 206-4, 206-5, 206-6, 206-7, 206-8, 206-9, 206-10, 206-11, and 206-12 (individually or collectively referred to as access lines 206), and memory cells 208-1 and 208-2 (individually or collectively referred to as memory cells 208) coupled to the vertical portions of the sense lines 201 and the access lines 206. Embodiments of the present disclosure are not, however, limited to a particular number of sense lines, access lines, or memory cells.

The sense line 201 may include vertical portions 202 and a horizontal portion 204. Each of the vertical portions 202 of the sense lines 201 may be located in a different vertical stack, as will be further described herein (e.g., in connection with FIG. 4). The horizontal portions 204 of the sense lines 201 may connect the vertical portions 202 of the sense line 201 at a top portion of the vertical stack. In some embodiments, the vertical portions 202 of the sense line 201 that are connected to the horizontal portions 204 of the sense line 201 at the top portion of the vertical stacks may not be connected to a horizontal portion (e.g., horizontal portion 104-2 of sense line 102 of FIG. 1) of the sense line 201 at the bottom portion of the vertical stacks.

The horizontal portion 204 connecting the vertical portions 202 of the sense line 201 may benefit the memory array by reducing cross tile difference and improving the flow of current in the memory array. In some embodiments, these benefits may be realized because the current may flow through the horizontal portion 204 of the sense line 201. For example, if a power source is closer to the vertical portion 202-1 of the sense line 201-1 than the vertical portion 202-4 of the sense line 202-1, the power source may generate a current that is applied to the sense line 201-1. In some embodiments, the current may flow from the bottom portion of the vertical portion 202-1 of the sense line 201-1 to the top portion of the vertical portion 202-1 of the sense line 201-1. The current may flow from the top portion of the vertical portion 202-1 of the sense line 201-1 to the top portion of the vertical portion 202-4 of the sense line 201-1 by flowing across the horizontal portion 204-1 of the sense line 201-1. That current may then flow to a memory cell 208 coupled to the vertical portion 202-4 of the sense line 201-1.

The horizontal portion 204 of the sense line 201 may benefit the memory device in which the current is applied. For example, allowing the current to flow through the horizontal portion 204 of the sense line 201 may reduce (e.g., prevent) cross tile difference and improve the flow of current, in a manner analogous to that previously described for sense line 101 in connection with FIG. 1.

Figure 3:
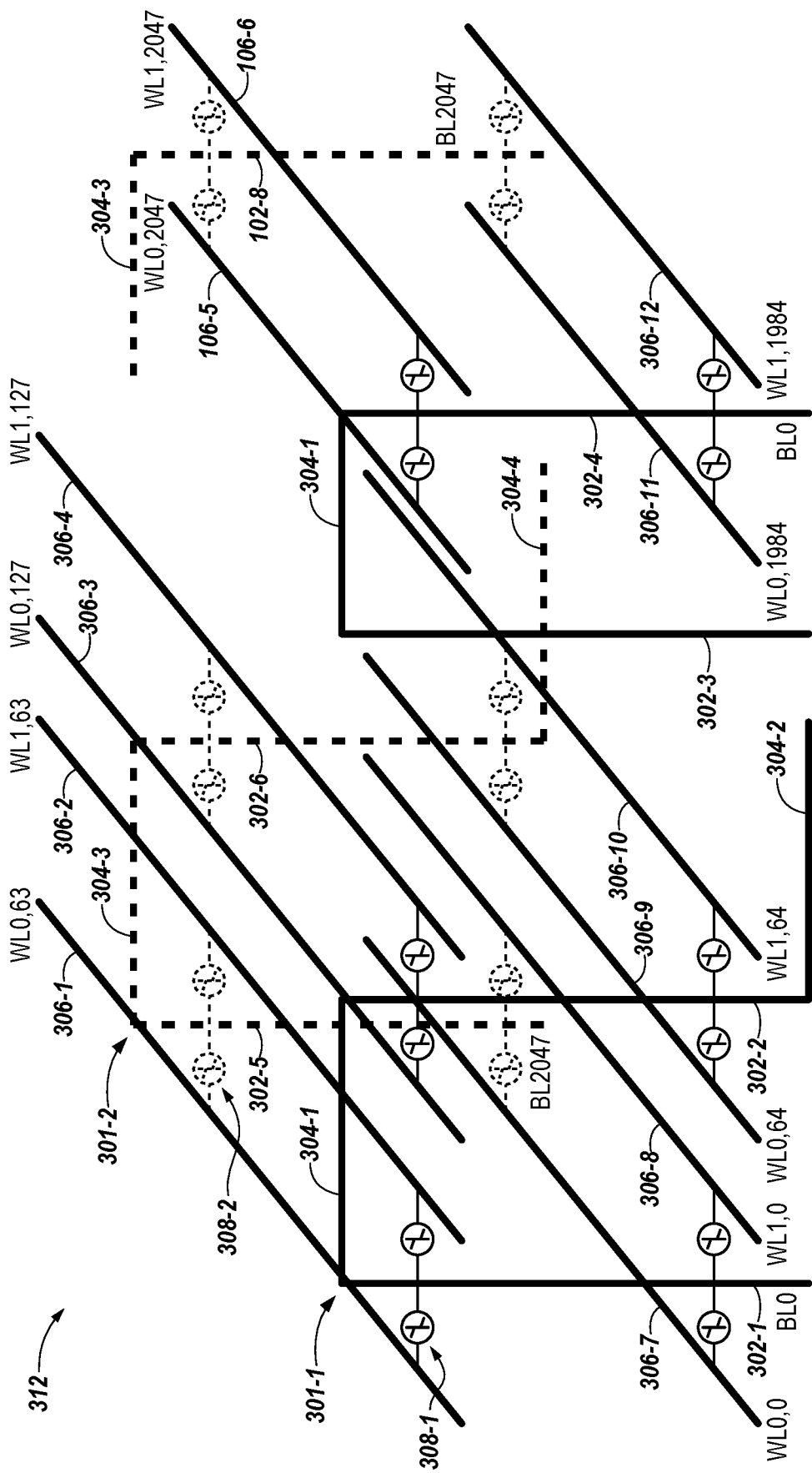
FIG. 3 illustrates a three-dimensional (3D) view of another example 3D memory array having a sense line formed in accordance with a number of embodiments of the present disclosure

FIG. 3 illustrates a 3D view of an example 3D memory array 312 having a sense line formed in accordance with a number of embodiments of the present disclosure. For example, as shown in FIG. 3, array 312 includes sense lines 301-1 and 301-2 (individually or collectively referred to as sense lines 301), vertical portions 302-1, 302-2, 302-3, 302-4, 302-5, 302-6, and 302-8 (individually or collectively referred to as vertical portions 302) of the sense lines 301, horizontal portions 304-1, 304-2, 304-3, and 304-4 (individually or collectively referred to as horizontal portions 304) of sense lines 301, access lines 306-1, 306-2, 306-3, 306-4, 306-5, 306-6, 306-7, 306-8, 306-9, 306-10, 306-11, and 306-12 (individually or collectively referred to as access lines 306), and memory cells 308-1 and 308-2 (individually or collectively referred to as memory cells 308) coupled to the vertical portions of the sense lines 301 and the access lines 306. Embodiments of the present disclosure are not, however, limited to a particular number of sense lines, access lines, or memory cells.

The sense lines 301 may include vertical portions 302 and horizontal portions 304. Each of the vertical portions 302 of the sense line 301 may be included in a vertical stack. The horizontal portions 304 of the sense line 301 may connect to the vertical portions 302 at a top portion of the vertical stacks and at a bottom portion of the vertical stacks. In some embodiments, vertical portions 302 of the sense line 301 that are connected to the horizontal portion 304 of the sense line 301 at the bottom portion of the vertical stacks may not be connected to the horizontal portion 304 of the sense line 301 at the top portion of the vertical stacks. For example, as shown in FIG. 3, if the vertical portions 302-2 and 302-3 of the sense line 301-1 may be connected at a bottom portion of the vertical stack, the vertical portions 302-2 and 302-3 may not also be connected at a top portion of the vertical stack. In some embodiments, vertical portions 302 of the sense line 301 that are connected to the horizontal portion 304 of the sense line 301 at the top portion of the vertical stacks may not be connected to the horizontal portion 304 of the sense line 301 at the bottom portion of the vertical stacks. For example, as shown in FIG. 3, if the vertical portions 302-1 and 302-2 of the sense line 301-1 are connected to the horizontal portion 304-1 of the sense line 301-1 at the top portion of the vertical stacks, the vertical portions 302-1 and 302-2 of the sense line 301-1 may not also be connected to the horizontal portion 304-2 of the sense line 301-1 at the bottom portion of the vertical stacks. In some embodiments, vertical portions 302 of the sense line 301 may be connected to the horizontal portion 304 of the sense line 301 at the top portion and the bottom portion of some vertical stacks. For example, as shown in FIG. 3, a vertical portion 302-2 of the sense line 301-1 may be connected to the vertical portion 302-1 at the top portion of the vertical stacks, and the vertical portion 302-2 of the sense line 301-1 may be connected to the vertical portion 302-3 at a bottom portion of the vertical stacks.

The horizontal portions 304 connecting the vertical portions 302 of the sense line 301 may benefit the memory array by reducing cross tile difference and improving the flow of current in the memory array. In some embodiments, these benefits may be realized because the current may flow through the horizontal portions 304 of the sense line 301. For example, if a power source is closer to the vertical portion 302-1 of the sense line 301-1 than it is to the vertical portion 302-4 of the sense line 301-1, the power source may generate a current that is applied to the sense line 301-1. In some embodiments, the current may flow from the bottom of the vertical portion 302-1 of the sense line 301-1 to the top of the vertical portion 302-1 of the sense line 301-1. The current may flow from the top of the vertical portion 302-1 of the sense line 301-1 to the top of the vertical portion 302-2 of the sense line 301-1 by flowing across the horizontal portion 304-1 of the sense line 301-1. That current may flow from the top of the vertical portion 302-2 of the sense line 301-1 to the bottom of the vertical portion 302-2 of the sense line 301-1. The current may then flow from the bottom of the vertical portion 302-2 of the sense line 301-1 to the bottom of the vertical portion 302-3 of the sense line 301-1 through the horizontal portion 304-2 of the sense line 301-1. The current may continue to flow in this pattern until it reaches its intended memory cell. By flowing through the memory array as described above, the amount of current lost while flowing through the memory cell may be reduced in comparison to if the current did not flow through the memory array as described above.

Figure 4:
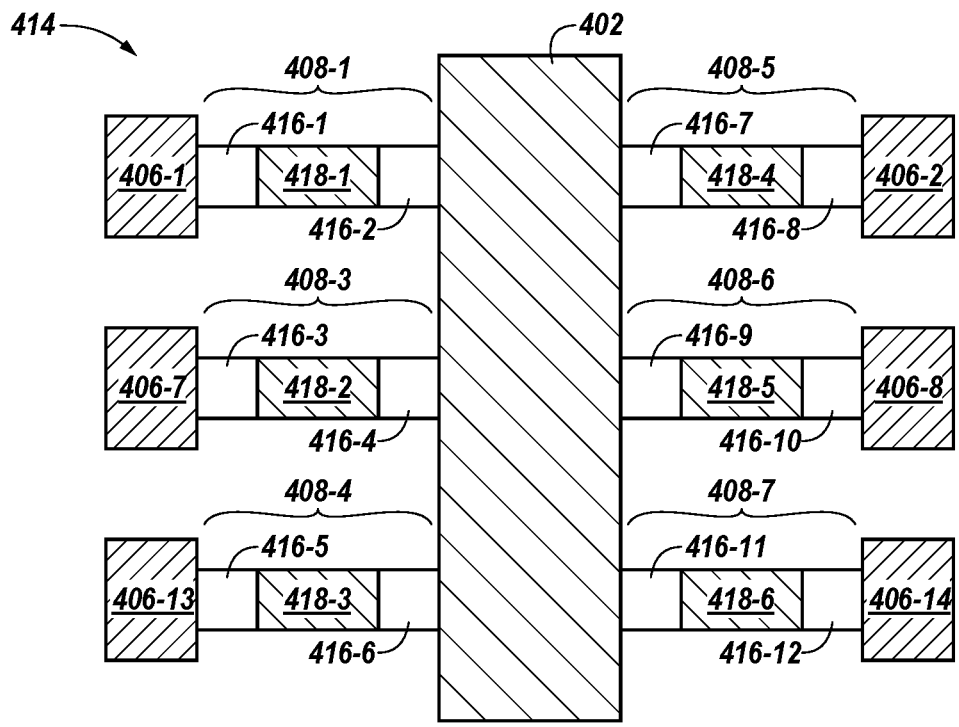
FIG. 4 illustrates a cross-sectional side view of an example vertical stack of a 3D memory array in accordance with a number of embodiments of the present disclosure.

FIG. 4 illustrates a cross-sectional side view of an example vertical stack 414 of a 3D memory array in accordance with a number of embodiments of the present disclosure. As shown in FIG. 4, vertical stack 414 can include a vertical portion 402 of a sense line (e.g., sense line 101 of FIG. 1), memory cells 408-1, 408-3, 408-4, 408-5, 408-6, and 408-7 (individually or collectively referred to as memory cells 408) having electrodes 416-1, 416-2, 416-3, 416-4, 416-5, 416-6, 416-7, 416-8, 416-9, 418-10, 416-11, and 416-12 (individually or collectively referred to as electrodes 416) and storage element material 418-1, 418-2, 418-3, 418-4, 418-5, and 418-6 (individually or collectively referred to as storage element material 418), and access lines 406-1, 406-2, 406-7, 406-8, 406-13, and 406-14 (individually or collectively referred to as access lines 406).

As shown in FIG. 4, a plurality of memory cells 408 may be coupled to the vertical portion of sense line 402. Each memory cell 408 may include a storage element material 418 and two electrodes 416 on opposing sides of the storage element material. In some embodiments, the memory cells 408 may be coupled to opposing sides of the sense line 402. For example, the memory cells 408-1 and 408-5 may be coupled to opposing sides of the sense line 402, the memory cells 408-3 and 408-6 may be coupled to opposing sides of the sense line 402, and memory cells 408-4 and 408-7 may be coupled to opposing sides of the sense line 402. In some embodiments, each electrode 416 may have a width of ten nanometers (nm) and each storage element material 418 may have a width of either 25 nm or 26 nm.

As shown in FIG. 4, each of the memory cells 408 may be coupled to a different respective access line 406. For example, memory cell 408-1 may be coupled to access line 406-1, memory cell 408-5 may be coupled to access line 406-2, etc. Each access line 406 that is coupled to a memory cell 408 may be perpendicular to the sense line 402. In some embodiments, each access line 406 may have a height of 50 nm and a width of 20 nm.

As stated above, a horizontal portion (e.g., horizontal portion 104 of FIG. 1) of a sense line (e.g., sense line 101 of FIG. 1) may connect vertical portion 402 of the sense line at the top and/or bottom portion of the vertical stack 414 which include the vertical portion 402 of the sense line. For example, in some embodiments, the horizontal portion of the sense line may connect vertical portion 402 of the sense line at the top of the vertical stack 414, but not at the bottom. In some embodiments, the horizontal sense line may connect the vertical portion 402 of the sense line at the bottom of the vertical stack 414, but not at the top. In some embodiments, the horizontal sense line may connect the vertical portion 402 of the sense line at both the top portion and the bottom portion of the vertical stack 414. In some embodiments, the horizontal portion of the sense line may connect a vertical portion 402 of the sense line to another vertical portion of the sense line at the top of the vertical stack 414, and the horizontal portion can connect the vertical portion 402 of the sense line to yet another vertical portion of the sense line at the bottom portion of the vertical stack. That is, a horizontal portion of the sense line may couple a single vertical portion 402 of the sense line to two separate vertical portions of the sense line, wherein the vertical portion 402 of the sense line may be connected to one of the other vertical portions of the sense line at the top of the vertical stack 414 and connected to the other vertical portion of the sense line at the bottom of the vertical stack 414.

Figure 5:
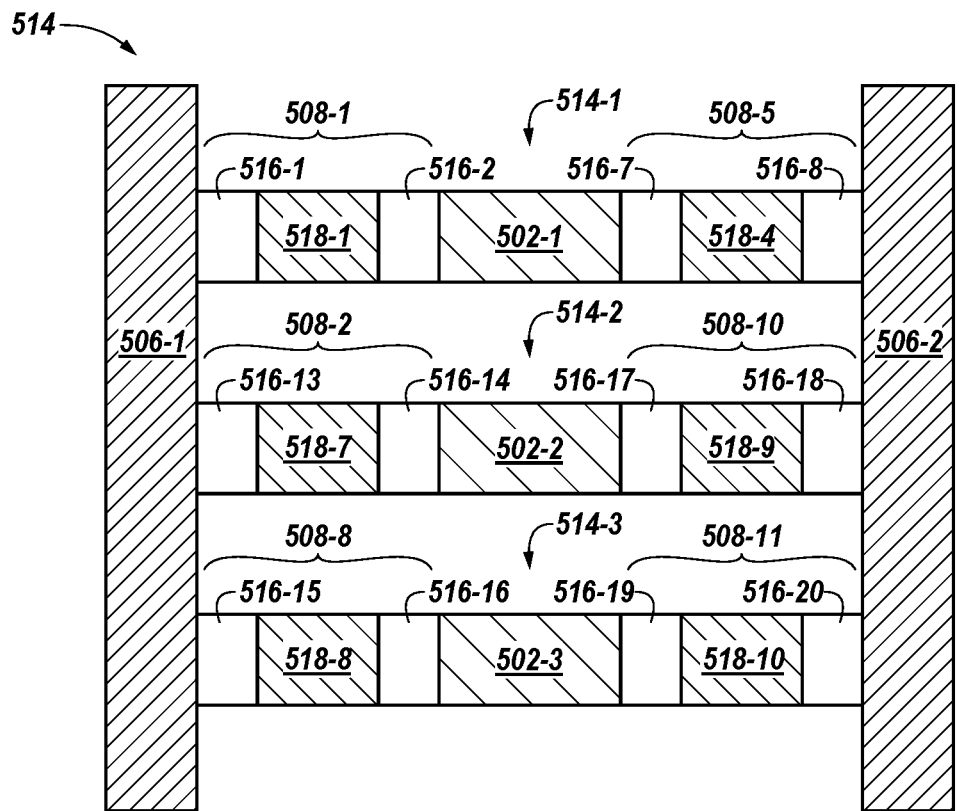
FIG. 5 illustrates a top-down view of example vertical stacks of a 3D memory array in accordance with a number of embodiments of the present disclosure.

FIG. 5 illustrates a top-down view of example vertical stacks 514 of a 3D memory array in accordance with a number of embodiments of the present disclosure. As shown in FIG. 5, vertical stacks 514-1, 514-2, and 514-3 (individually or collectively referred to as vertical stack 514) can include a vertical portions 502-1, 502-2, and 502-3 (individually or collectively referred to as vertical portions 502) of a sense line, memory cells 508-1, 508-2, 508-5, 508-8, 508-10, and 508-11 (individually or collectively referred to as memory cells 508) having electrodes 516-1, 516-2, 516-7, 516-8, 516-13, 516-14, 516-15, 516-16, 516-17, 518-18, 516-19, and 516-20 (individually or collectively referred to as electrodes 516) and storage element material 518-1, 518-4, 518-7, 518-8, 518-9, and 518-10 (individually or collectively referred to as storage element material 518), and access lines 506-1 and 506-2 (individually or collectively referred to as access lines 506).

As shown in FIG. 5, each of the plurality of vertical stacks 514 may include a vertical portion 502 of a sense line, a plurality of memory cells 508 coupled to the vertical portion 502 of the sense line, and a plurality of access lines 506 coupled to the memory cells 508. In some embodiments, the vertical portion 502 of the sense line may have a width of 50 nm. Each memory cell 508 may include a storage element material 518 coupled to a plurality of electrodes 516. As shown in FIG. 5, each of the plurality of vertical stacks 514 may be formed adjacent each other.

FIG. 5 shows a specific portion of the plurality of vertical stacks 514. As previously shown in FIG. 4, each of the plurality of vertical stacks 514 may be coupled to memory cells 508 and access lines 506 at different portions of the vertical portion 502 of the sense line. As shown in FIG. 5, memory cells 508 coupled to the same portion of each of the plurality of vertical portions 502 of the sense line may be coupled to the same access line 506.

FIGS. 6A-6J illustrate cross-sectional views of processing steps associated with forming a 3D memory array in accordance with a number of embodiments of the present disclosure. The process illustrated in FIGS. 6A-6J is shown at particular points in time that correspond to processing activities for the 3D memory array formation process. Other processing activities included in a particular 3D memory array formation sequence may be omitted for ease of illustration.

Figure 6A:
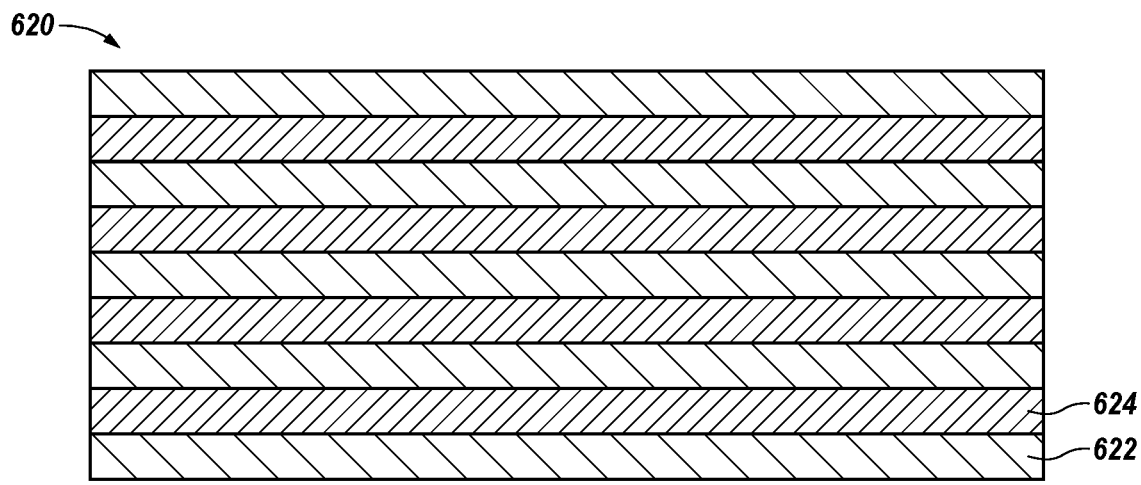
FIGS. 6A-6J illustrate cross-sectional views of processing steps associated with forming a 3D memory array in accordance with a number of embodiments of the present disclosure.

FIG. 6A illustrates formation (e.g., deposition) of a dielectric material 622 and a storage element material 624 at a point in time 620. In some embodiments, the storage element material 624 may be a chalcogenide material, and the dielectric material can be an oxide material, such as, but not limited to, aluminum oxide (AlOx). The dielectric material 622 and the storage element material 624 may be formed over a semiconductor material that was formed over a substrate material, or may be formed over a sense line material (not shown in FIG. 6A). The dielectric material 622 and the storage element material 624 may be alternatively formed over each other as illustrated in FIG. 6A. In some embodiments, the dielectric material 622 and the storage element material 624 may be repeatedly formed over each other to form a stack of up to 64 layers dielectric material 622 and storage element material 624. In some embodiments, a horizontal portion of the sense line may be formed in the substrate material, and the dielectric material 622 and the storage element material 624 may be formed over the horizontal portion of the sense line material.

Figure 6B:
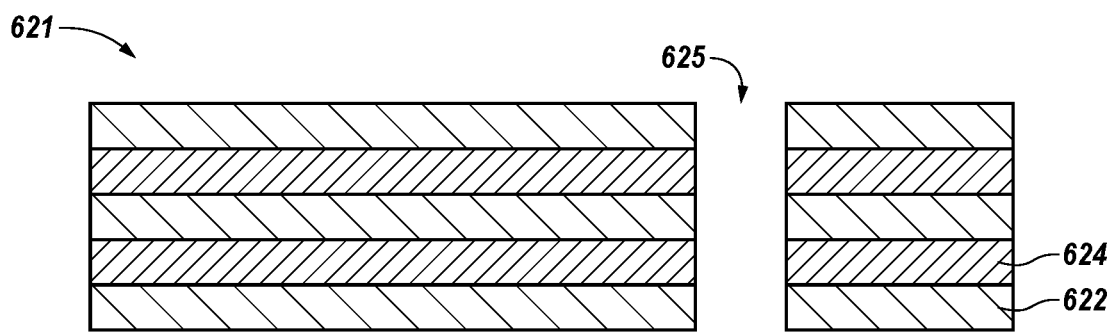

FIGS. 6B-6E illustrate a formation of a vertical portion of a sense line at a point in time 621. In FIG. 6B, opening 625 may be formed in the dielectric material 622 and the storage element material 624. In some embodiments, the opening may be formed using a non-selective etch. In some embodiments, a plurality of openings analogous to opening 625 may be formed.

Figure 6C:
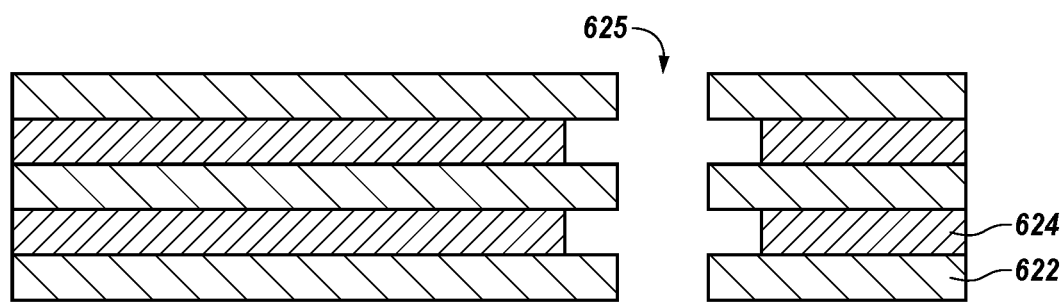

In FIG. 6C, the storage element material 624 adjacent opening 625 may be removed using a selective etch.

Figure 6D:
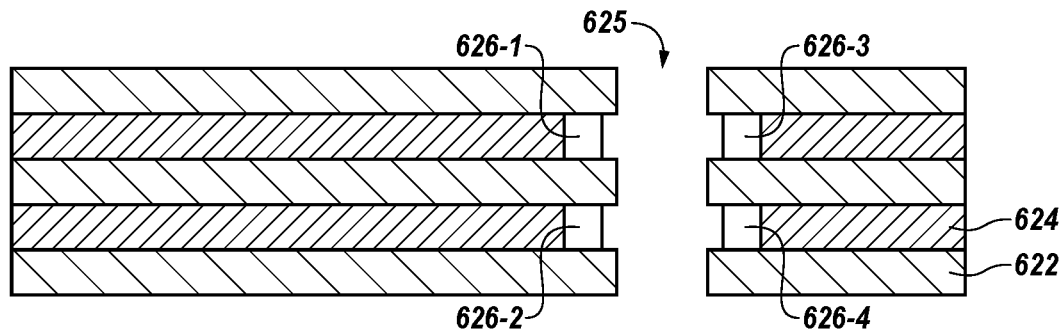

In FIG. 6D, an electrode material 626-1, 626-2, 626-3, and 626-4 (individually or collectively referred to as electrode material 626) may be formed in the areas from which portions of the storage element material 624 adjacent opening 625 were removed and then a portion of electrode material 626 can be removed.

Figure 6E:
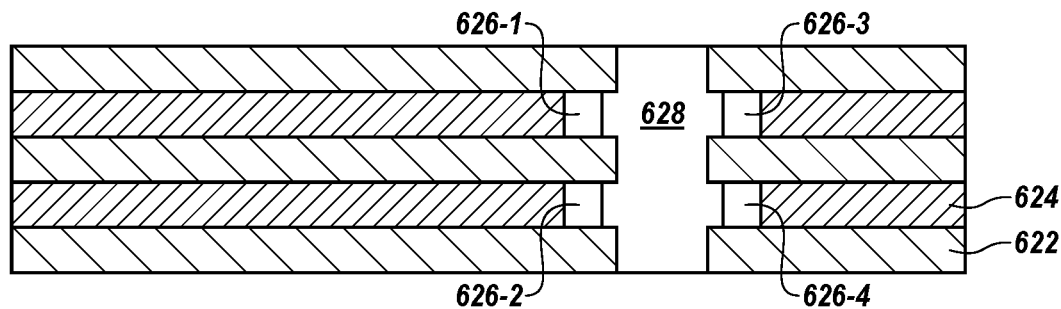

In FIG. 6E, a sense line material 628 may be formed in opening 625. For instance, the sense line material 628 may be formed adjacent the electrode material 626 in opening 625. In some embodiments, the sense line material 628 may be formed using atomic layer deposition (ALD). In some embodiments, an access line material (e.g., access line material 630 of FIG. 6H) may be deposited in the opening 625 instead of sense line material 628.

Figure 6F:
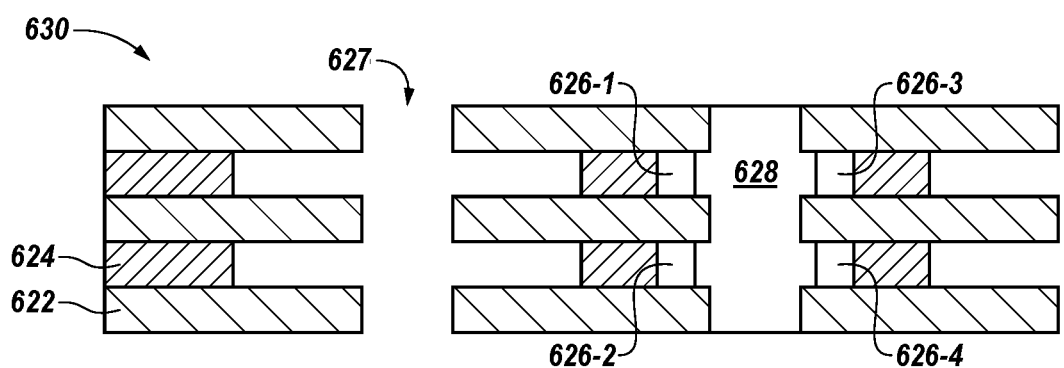

FIGS. 6F-6I illustrate a formation of access lines at a point in time 630. In FIG. 6F, an opening 627 may be formed in the dielectric material 622 and the storage element material 624. In some embodiments, opening 627 may be formed using a non-selective etch. Opening 627 may be formed adjacent to opening 625. In some embodiments, a plurality of openings analogous to opening 627 may be formed. Further, as shown in FIG. 6F, portions of the storage element material 624 adjacent opening 627 may be further removed using a selective etch. In some embodiments, more storage element material 624 adjacent opening 627 is removed than adjacent opening 625.

Figure 6G:
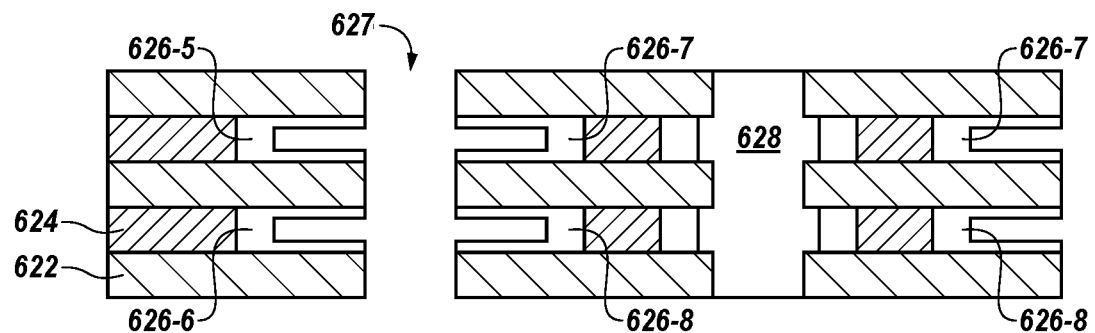

In FIG. 6G, an electrode material 626-5, 626-6, 626-7, and 626-8 (individually or collectively referred to as electrode material 626) may be formed in the area from which portions of the storage element material 624 was removed. A portion of the electrode material 626 may be removed from the area adjacent opening 627, as shown in FIG. 6G.

Figure 6H:
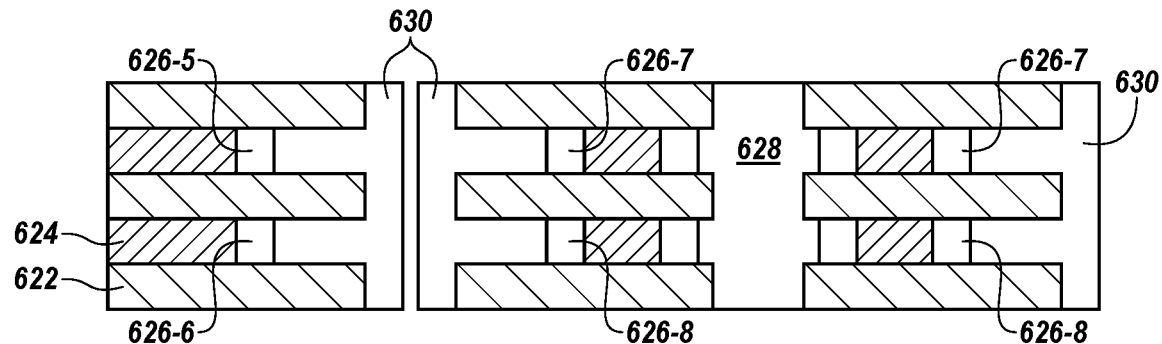

In FIG. 6H, an access line material 630 may be formed (e.g., deposited) in opening 627 adjacent electrode material 626. For instance, the access line material 630 may fill in the space from which the electrode material 626 was removed as shown in FIG. 6H.

Figure 6I:
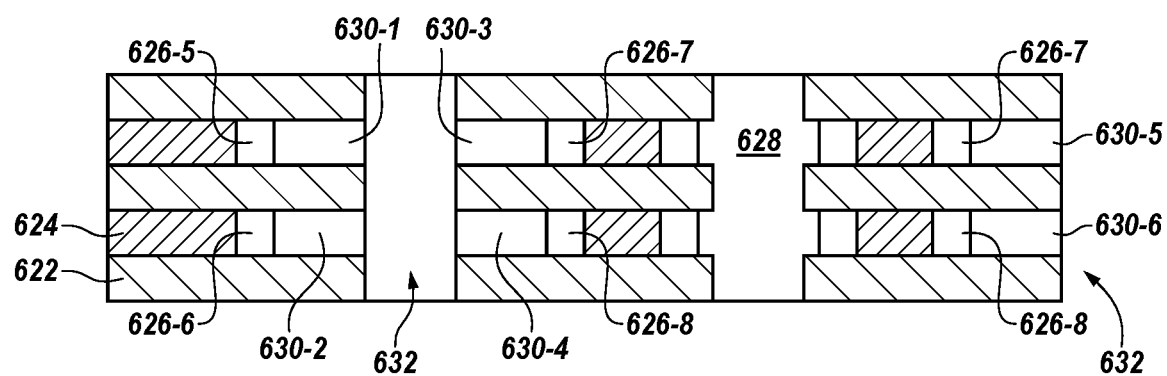

In FIG. 6I, the access line material 630 may be removed from opening 627 and remain in the space from which the electrode material 626 was removed. After removing the access line material 630 from opening 627, a dielectric material 632 may be formed in opening 627, as shown in FIG. 6I. In some embodiments, the dielectric material 622 and the dielectric material 632 may be different materials. In some embodiments, the dielectric material 622 and the dielectric material 632 may be the same material.

Figure 6J:
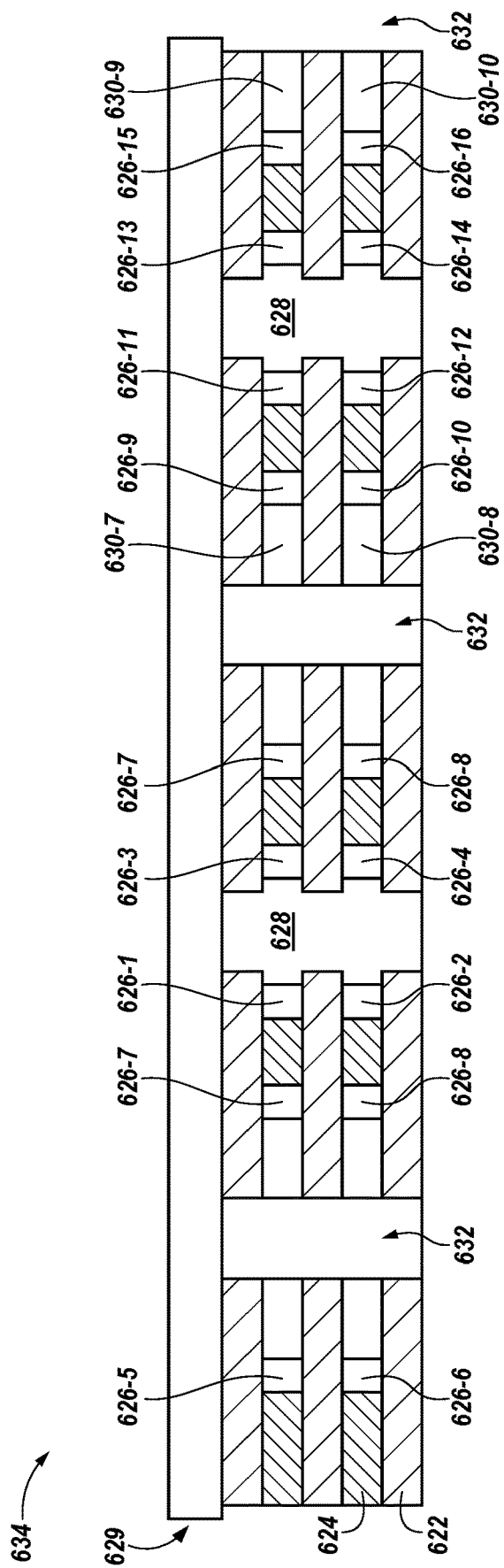

FIG. 6J illustrates the formation of a horizontal portion 629 of the sense line at a point in time 634. In FIG. 6J, a horizontal portion 629 of the sense line may be formed over the vertical portion 628 of the sense line and the dielectric material 632. In some embodiments, the vertical portion 628 of the sense line and the horizontal portion 629 of the sense line may be the same material. In some embodiments, the vertical portion 628 and the horizontal portion 629 of the sense line may be different materials. The horizontal portion 629 of the sense line may connect the vertical portions 628 of the sense lines at the top of the vertical stacks (e.g., vertical stacks 414 of FIG. 4). In some embodiments, the access line material and the sense line material may be the same material. In some embodiments, a horizontal portion of an access line may connect vertical portions of an access line, formed in an opening instead of a sense line material, at the top of the vertical stacks.

Figure 7:
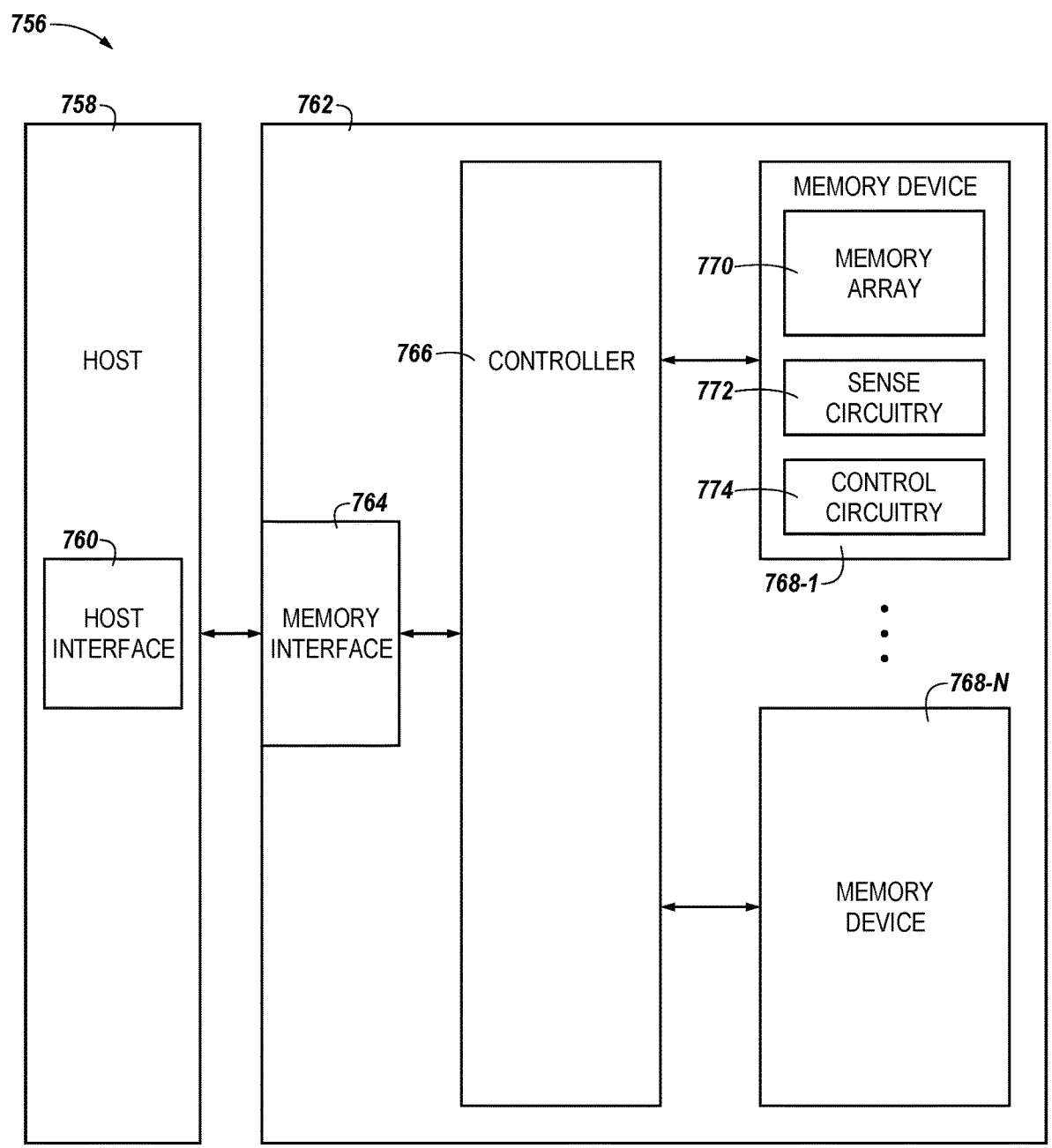
FIG. 7 is a functional block diagram of a computing system including at least one memory array formed in accordance with a number of embodiments of the present disclosure.

FIG. 7 is a functional block diagram of a computing system 756 including at least one memory array 770 formed in accordance with a number of embodiments of the present disclosure. The numbering convention used in connection with FIG. 7 does not follow the earlier introduced numbering convention and sequence that applies to FIGS. 1-6.

In the embodiment illustrated in FIG. 7, memory system 762 includes a memory interface 764, a number of memory devices 768-1, . . . , 768-N, and a controller 766 selectably coupled to the memory interface 764 and memory devices 768-1, . . . , 768-N. Memory interface 764 may be used to communicate information between memory system 762 and another device, such as a host 758. Host 758 may include a processor (not shown). As used herein, "a processor" may be a number of processors, such as a parallel processing system, a number of coprocessors, etc. Example hosts may include, or be implemented in, laptop computers, personal computers, digital cameras, digital recording devices and playback devices, mobile telephones, PDAs, memory card readers, interface hubs, and the like. Such a host 758 may be associated with fabrication operations performed on semiconductor devices and/or SSDs.

In a number of embodiments, host 758 may be associated with (e.g., include or be coupled to) a host interface 760. The host interface 760 may enable an input of scaled preferences (e.g., in numerically and/or structurally defined gradients) to define, for example, critical dimensions (CDs) of a final structure or intermediary structures of a memory device (e.g., as shown at 768) and/or an array of memory cells (e.g., as shown at 770) formed thereon to be implemented by a processing apparatus (not shown). The array includes access devices having semiconductor structures, access lines, and dielectric material formed according to embodiments described herein. The scaled preferences may be provided to the host interface 760 via input of a number of preferences stored by the host 758, input of preferences from another storage system (not shown), and/or input of preferences by a user (e.g., a human operator).

Memory interface 764 may be in the form of a standardized physical interface. For example, when memory system 762 is used for information (e.g., data) storage in computing system 756, memory interface 764 may be a serial advanced technology attachment (SATA) interface, a peripheral component interconnect express (PCIe) interface, or a universal serial bus (USB) interface, among other physical connectors and/or interfaces. In general, however, memory interface 764 may provide an interface for passing control, address, information, scaled preferences, and/or other signals between the controller 766 of memory system 762 and a host 758 (e.g., via host interface 760).

Controller 766 may include, for example, firmware and/or control circuitry (e.g., hardware). Controller 766 may be operably coupled to and/or included on the same physical device (e.g., a die) as one or more of the memory devices 768-1, . . . , 768-N. For example, controller 766 may be, or may include, an ASIC as hardware operably coupled to circuitry (e.g., a printed circuit board) including memory interface 764 and memory devices 768-1, . . . , 768-N. Alternatively, controller 766 may be included on a separate physical device that is communicatively coupled to the physical device (e.g., the die) that includes one or more of the memory devices 768-1, . . . , 768-N.

Controller 766 may communicate with memory devices 768-1, . . . , 768-N to direct operations to sense (e.g., read), program (e.g., write), and/or erase information, among other functions and/or operations for management of memory cells. Controller 766 may have circuitry that may include a number of integrated circuits and/or discrete components. In a number of embodiments, the circuitry in controller 766 may include control circuitry for controlling access across memory devices 768-1, . . . , 768-N and/or circuitry for providing a translation layer between host 758 and memory system 762.

Memory devices 768-1, . . . , 768-N may include, for example, a number of memory arrays 770 (e.g., arrays of volatile and/or non-volatile memory cells). For instance, memory devices 768-1, . . . , 768-N may include arrays of memory cells, formed according to the embodiments disclosed herein. As will be appreciated, the memory cells in the memory arrays 770 of memory devices 768-1, . . . , 768-N may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory device 768 may be formed on the same die. A memory device (e.g., memory device 768-1) may include one or more arrays 770 of memory cells formed on the die. A memory device may include sense circuitry 772 and control circuitry 774 associated with one or more arrays 770 formed on the die, or portions thereof. The sense circuitry 772 may be utilized to determine (sense) a particular data value (e.g., 0 or 1) that is stored at a particular memory cell in a row of an array 770. The control circuitry 774 may be utilized to direct the sense circuitry 772 to sense particular data values, in addition to directing storage, erasure, etc., of data values in response to a command from host 758 and/or host interface 760. The command may be sent directly to the control circuitry 774 via the memory interface 764 or to the control circuitry 774 via the controller 766.

The embodiment illustrated in FIG. 7 may include additional circuitry that is not illustrated so as not to obscure embodiments of the present disclosure. For example, memory device 768 may include address circuitry to latch address signals provided over I/O connectors through I/O circuitry. Address signals may be received and decoded by a row decoder and a column decoder to access a memory array 770. It will be appreciated that the number of address input connectors may depend on the density and/or architecture of memory devices 768 and/or memory arrays 770.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, oxide materials, nitride materials, buffer materials, etch chemistries, etch processes, solvents, memory devices, memory cells, openings, among other materials and/or components related to semiconductor structure formation, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, oxide materials, nitride materials, buffer materials, etch chemistries, etch processes, solvents, memory devices, memory cells, sidewalls of openings and/or trenches related to semiconductor structure formation than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   forming a first dielectric material and a storage element material over a semiconductor material;
   forming a first plurality of openings in the first dielectric material and the storage element material;
   removing portions of the storage element material adjacent the first plurality of openings;
   forming a first electrode material in an area from which the portions of the storage element material were removed;

forming a sense line material in the first plurality of openings adjacent the first electrode material;
forming a second plurality of openings in the first dielectric material and the storage element material;
removing portions of the storage element material adjacent the second plurality of openings;
forming a second electrode material in an area from which the portions of the storage element material adjacent the second plurality of openings were removed;
forming an access line material in the second plurality of openings adjacent the second electrode material;
removing a portion of the access line material from the second plurality of openings;
forming a second dielectric material in an area from which the portion of the access line material was removed; and
forming a horizontal sense line material over the sense line material to connect the sense line material formed in the first plurality of openings.

2. The method of claim 1, further comprising alternatively forming the first dielectric material and the storage element material over each other.

3. The method of claim 1, further comprising forming the first and second plurality of openings using a non-selective etch.

4. The method of claim 1, further comprising removing the portions of the storage element material adjacent the first and second plurality of openings using a selective etch.

5. The method of claim 1, further comprising removing more storage element material adjacent the second plurality of openings than storage element material adjacent the first plurality of openings.

6. The method of claim 5, further comprising removing a portion of the first electrode material and the second electrode material.

7. The method of claim 1, further comprising forming the sense line material using atomic layer deposition (ALD).

8. The method of claim 1, wherein the sense line material and the access line material are a same material.

9. The method of claim 1, wherein the first and second dielectric materials are different materials.

10. The method of claim 1, further comprising forming the second plurality of openings adjacent to the first plurality of openings.

11. A method, comprising:
forming a first horizontal sense line material in a substrate material;
forming a first dielectric material and a storage element material over the horizontal sense line material;
forming a first plurality of openings in the first dielectric material and the storage element material;
removing portions of the storage element material adjacent the first plurality of openings;
forming a first electrode material in an area from which the storage element material was removed;
forming a sense line material in the first plurality of openings;
forming a second plurality of openings in the first dielectric material and the storage element material;
removing portions of the storage element material adjacent the second plurality of openings;
forming a second electrode material in an area from which the portions of the storage element material adjacent the second plurality of openings were removed;
forming an access line material in the second plurality of openings adjacent the second electrode material;
removing a portion of the access line material from the second plurality of openings;
forming a second dielectric material in an area from which the access line material was removed; and
forming a second horizontal sense line material over the sense line material to connect the sense line material formed in the first plurality of openings.

12. The method of claim 11, further comprising forming the second dielectric material in the second plurality of openings.

13. The method of claim 11, further comprising forming the access line material in the first plurality of openings and forming the sense line material in the second plurality of openings.

14. The method of claim 13, further comprising forming a horizontal access line material over the access line material to connect the access line material formed in the first plurality of openings.

15. A method, comprising:
forming a three-dimensional (3D) memory array by:
forming a sense line that includes vertical portions and horizontal portions; and
forming a plurality of vertical stacks, wherein forming each respective one of the vertical stacks includes:
forming a different respective vertical portion of the sense line, wherein the different respective vertical portion of the sense line of each respective vertical stack is in contact with multiple layers of its respective vertical stack;
forming a first memory cell coupled to the different respective vertical portion of the sense line;
forming a second memory cell coupled to the different respective vertical portion of the sense line;
forming a first access line coupled to the first memory cell, wherein the first access line is perpendicular to the different respective vertical portion of the sense line; and
forming a second access line coupled to the second memory cell, wherein the second access line is perpendicular to the different respective vertical portion of the sense line.

16. The method of claim 15, further comprising forming a third memory cell coupled to the different respective vertical portion of the sense line and a fourth memory cell coupled to the different respective vertical portion of the sense line.

17. The method of claim 16, further comprising forming the third memory cell on a same side of the different respective vertical portion of the sense line as the first memory cell.

18. The method of claim 16, further comprising forming the fourth memory cell on a same side of the different respective vertical portion of the sense line as the second memory cell.

19. The method of claim 16, further comprising forming the third memory cell and the fourth memory cell on opposing sides of the different respective vertical portion of the sense line.

20. The method of claim 16, further comprising forming a third access line coupled to the third memory cell and forming a fourth access line coupled to the fourth memory cell, wherein the third access line and the fourth access line are perpendicular to the different respective vertical portion of the sense line.

* * * * *